United States Patent
Wu et al.

(10) Patent No.: US 8,451,033 B2
(45) Date of Patent: May 28, 2013

(54) MILLIMETER-WAVE WIDEBAND FREQUENCY DOUBLER

(75) Inventors: Po-Yi Wu, Baoshan (TW); Hsieh-Hung Hsieh, Taipei (TW); Ho-Hsiang Chen, Hsinchu (TW); Tzu-Jin Yeh, Hsinchu (TW); Chewn-Pu Jou, Chutung (TW); Fu-Lung Hsueh, Cranbury, NJ (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 352 days.

(21) Appl. No.: 12/967,160

(22) Filed: Dec. 14, 2010

(65) Prior Publication Data

US 2012/0146747 A1 Jun. 14, 2012

(51) Int. Cl.
*H03B 19/00* (2006.01)
(52) U.S. Cl.
USPC .......................... 327/122; 333/218
(58) Field of Classification Search
USPC .................. 333/218; 327/113, 116, 119, 122
See application file for complete search history.

(56) References Cited

U.S. PATENT DOCUMENTS

| 4,754,244 A | 6/1988 | Pavio |
| 6,057,714 A * | 5/2000 | Andrys et al. ................. 327/105 |
| 7,227,392 B2 * | 6/2007 | Yamamoto ..................... 327/122 |

OTHER PUBLICATIONS

Tang, Y.L. et al., "A Broadband PHEMT MMIC Distributed Doubler Using High-Pass Drain Line Technology", IEEE Microwave and Wireless Components Letters, May 2004, 14(5):201-203.
Deng, K.L. et al., "A Miniature Broad-Band pHEMT MMIC Balanced Distributed Doubler", IEEE Transaction on Microwave Theory and Techniques, Apr. 2003, 51(4):1257-1261.

* cited by examiner

*Primary Examiner* — Dean O Takaoka
(74) *Attorney, Agent, or Firm* — Duane Morris LLP

(57) ABSTRACT

A millimeter-wave wideband frequency doubler stage for use in a distributed frequency doubler includes: a differential input pair of transistors, each transistor having respective gate, drain and source terminals, wherein the source terminals are coupled together to a first power supply node and the drain terminals are coupled together at a first node to a second power supply node; first and second pairs of bandpass gate lines coupled to the gate terminals of the transistors; and a pair of bandpass drain lines coupled to the drain terminals of the transistors.

18 Claims, 9 Drawing Sheets

200

300

400

500

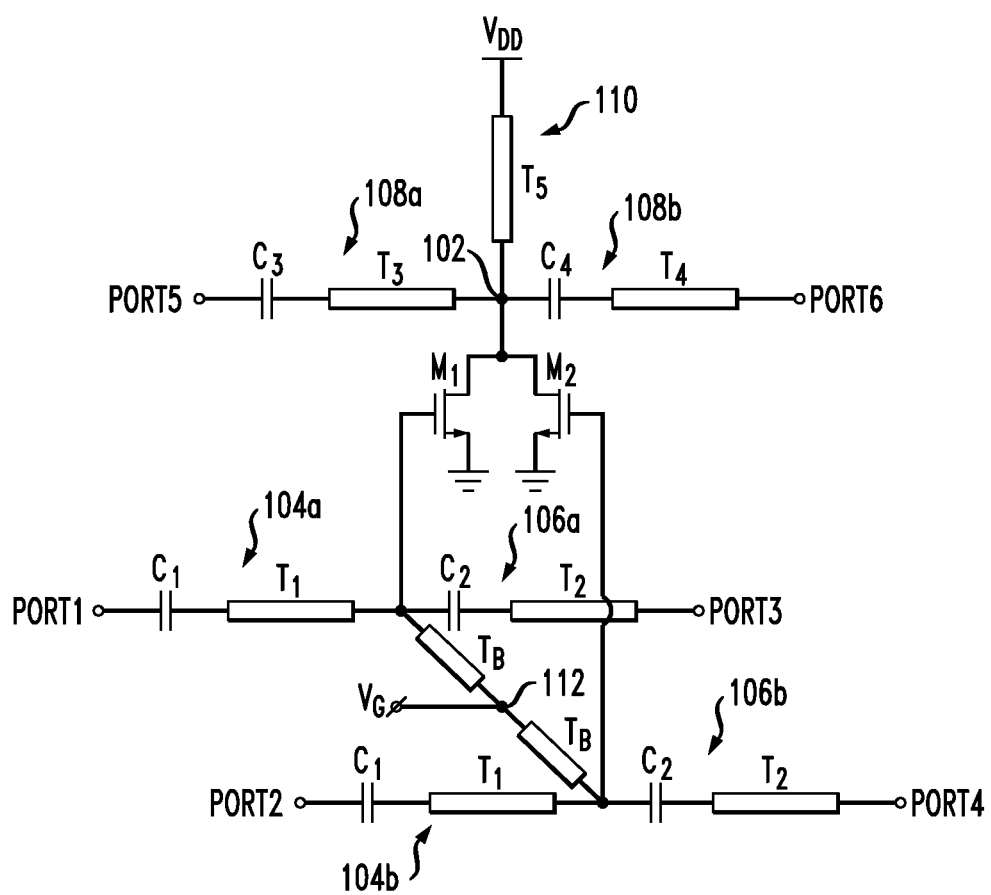

FIG. 10
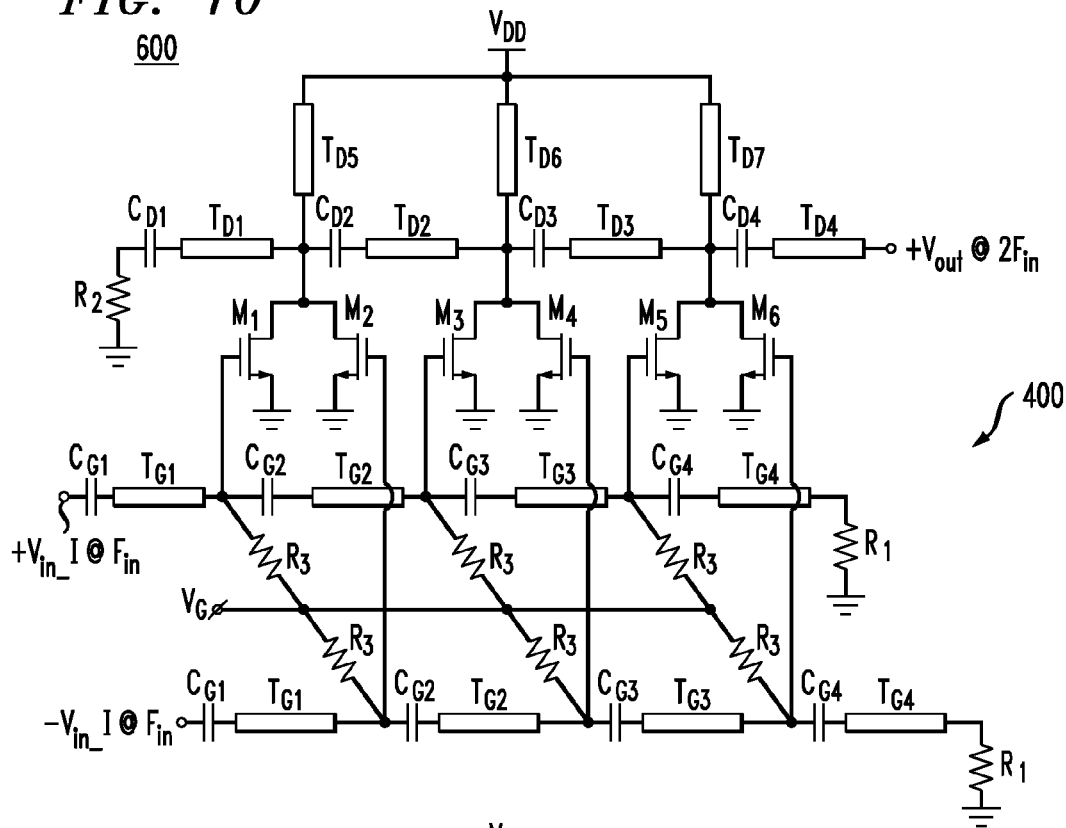
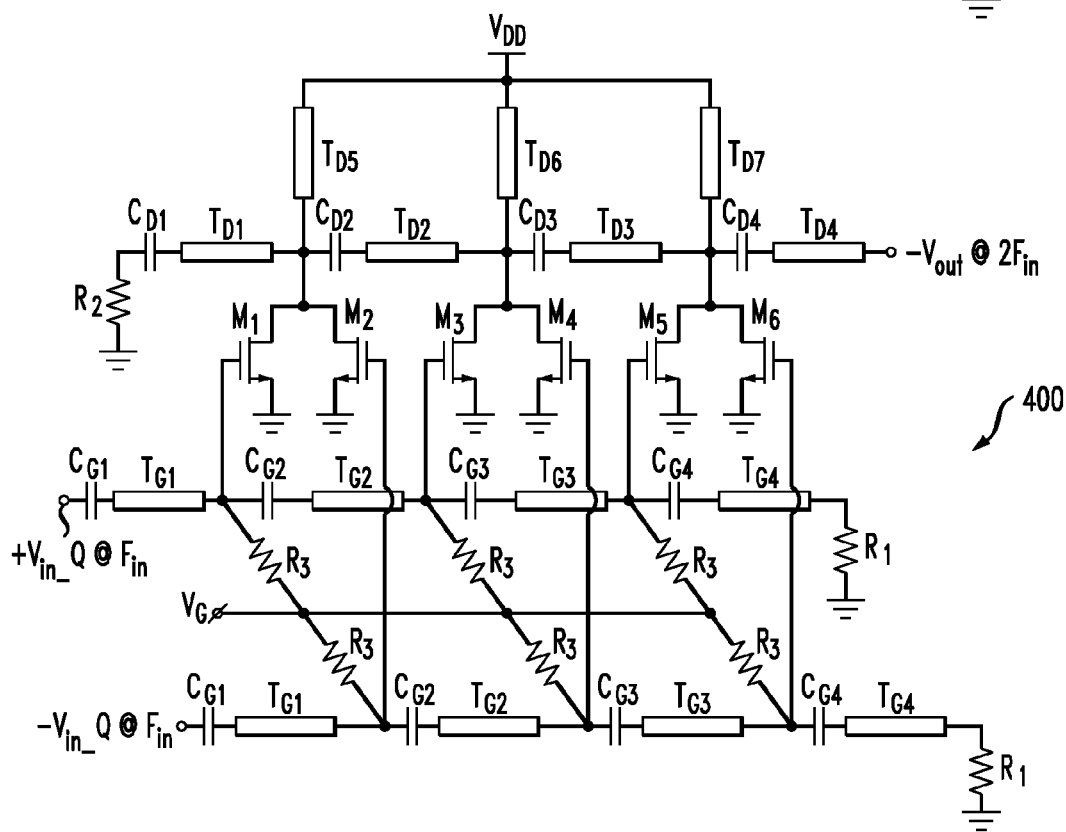

MILLIMETER-WAVE WIDEBAND FREQUENCY DOUBLER

TECHNICAL FIELD

The present invention relates to millimeter-wave circuits and more specifically to frequency doublers for using in millimeter-wave circuits.

BACKGROUND

Wireless applications such as wireless personal area networks (WPANs), automotive radar, image sensing and others use millimeter-wave sources (i.e., sources operating at frequencies between 30-300 GHz). These millimeter-wave sources can be implemented either using fundamental oscillators or frequency doublers cascaded with lower frequency oscillators.

In millimeter-wave applications it is difficult to attain a high quality (i.e., low-phase noise) reference signal over a wide frequency range. With reference to frequency doubler architectures, wideband frequency doublers are preferred. One such wideband frequency doubler configured for wideband operation is the distributed frequency doubler. With the use of a differential input scheme, better fundamental rejection can be achieved. Distributed frequency doubler designs utilizing high-pass drain lines have been proposed to provide even better fundamental rejection. However, improvements in the performance of such devices are still needed.

BRIEF DESCRIPTION OF THE DRAWINGS

The accompanying drawings illustrate various embodiments of ESD protection circuits, as well as other information pertinent to the disclosure, in which:

FIG. 8 illustrates an alternative embodiment of the basic cell or stage of FIG. 2;

FIG. 10 illustrates a three-stage quadrature-phased enabled distributed wideband frequency doubler based on the basic cell or stage of FIG. 2.

DETAILED DESCRIPTION

This description of the exemplary embodiments is intended to be read in connection with the accompanying drawings, which are to be considered part of the entire written description. Terms concerning coupling (electrical or mechanical) and the like, such as "coupled," "connected" and "interconnected," refer to a relationship wherein structures are secured, attached or communicate to one another either directly or indirectly through intervening structures, unless expressly described otherwise.

Figure 1:
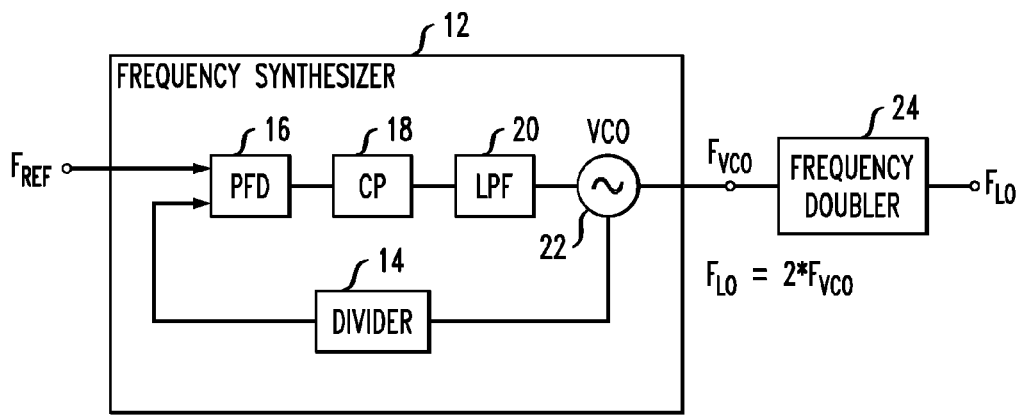
FIG. 1 is a schematic block diagram of a millimeter-wave frequency generator having a frequency doubler.

FIG. 1 is block diagram of a millimeter-wave frequency generator 10. The frequency generator may be used in a wireless transmitter or receiver device, for example. The frequency generator includes a frequency synthesizer 12 arranged as a phased lock loop (PLL) that provides a voltage controlled oscillator (VCO) signal having a frequency $F_{VCO}$ in response to a signal having a reference frequency $F_{REF}$. The operation of the frequency synthesizer 12 should be familiar to those skilled in this art and need not be detailed herein. Typically, the frequency synthesizer 12 includes a phase frequency detector (PFD) 16 have the reference signal having a frequency $F_{REF}$ as its input and an output coupled to a charge pump (CP) 18. The output of the CP 18 is coupled to a low-pass filter (LPF) 20. The output of the LPF 20 is coupled to a voltage-controlled oscillator (VCO) 22, which outputs the signal having frequency $F_{VCO}$. A feedback loop through frequency divider 14 is provided from the output of VCO 22 to a second input of the PFD 16. The frequency synthesizer 12 is cascaded with a frequency doubler 24 for providing a low-phase-noise local (LO) signal having frequency $F_{LO}$ with a wide frequency range. This disclosure focuses on improvements to the frequency doubler 24 for use in such an arrangement.

Figure 2:
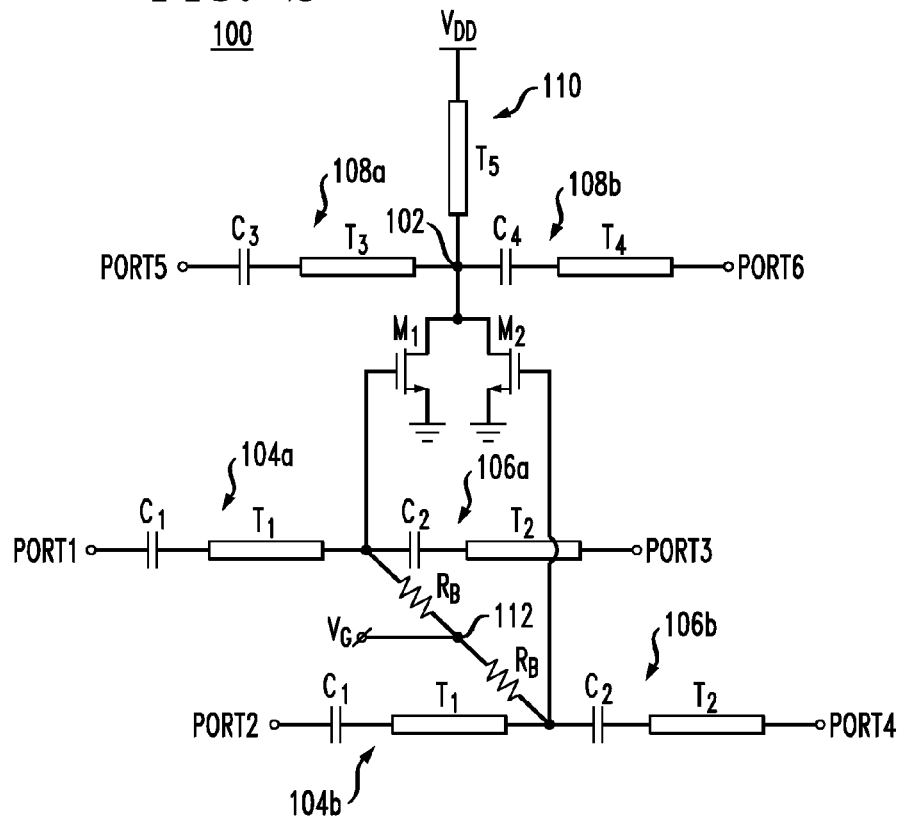
FIG. 2 is circuit diagram of a basic cell or stage for use in forming a distributed wideband frequency doubler.

FIG. 2 illustrates the basic frequency doubler cell (or stage) 100 of an embodiment of a wideband frequency doubler. This frequency doubler cell 100 can be cascaded, as discussed in more detail below, with other like cells to form a distributed wideband frequency doubler. The frequency doubler cell 100 is based on a differential input scheme, which provides for good fundamental rejection.

The frequency doubler cell includes a differential input pair of transistors M1 and M2. In the embodiment shown, transistors M1 and M2 are NMOS transistors. Each transistor M1, M2 has a respective gate terminal, a drain terminal and a source terminal. The transistors are coupled together in a common-source/common-drain FET configuration that provides even harmonics of the input signal. The source terminals are coupled together to a first power supply node corresponding to a lower power supply, e.g., ground or $V_{SS}$. The drain terminals of the transistors M1, M2 are coupled together at a node 102. Differential input ports Port1 and Port2 are coupled to the gate terminals of the transistors M1 and M2, respectively, through a first pair of bandpass gate lines 104a, 104b, respectively. Bandpass gate line 104a includes a capacitor $C_1$ and transmission line $T_1$ coupled between Port1 and the gate terminal of transistor M1. Similarly, bandpass gate line 104b includes a capacitor $C_1$ and transmission line $T_1$ coupled between Port2 and the gate terminal of transistor M2.

A second pair of bandpass gate lines 106a, 106b is coupled between the gate terminals of transistors M1, M2 and Port3 and Port4, respectively. Each of these bandpass gate lines 106a, 106b includes a capacitor C2 and transmission line T2 coupled in series between the gate terminal of transistor M1 or M2 and the Port3 or Port4 port. As will become evident from the discussion of FIG. 3, for example, Port3 and Port4 are used to either terminate a one cell wideband frequency doubler, e.g., by connection to termination resistors, or to connect a cell 100 to another (i.e., the next) like cell 100 in a multi-cell distributed frequency doubler architecture. The bandpass gate lines can suppress unwanted low-frequency and high-frequency interference, resulting in a high-Q output signal.

The cell 100 also includes a pair of bandpass drain lines 108a, 108b coupled to the drain terminals of the transistors M1, M2. Specifically, the first bandpass drain line 108a is coupled between Port5 and node 102 and includes capacitor $C_3$ and transmission line $T_3$. The second bandpass drain line 108b is coupled between Port6 and node 102 and includes capacitor $C_4$ and transmission line $T_4$. As will become evident from the remainder of the disclosure, Port5 and Port6 ports can be connected to a termination resistor, be used as an output port to provide an output signal or be used to connect cell 100 to another (i.e., the next or previous) like cell 100 in a multi-cell distributed frequency doubler architecture.

The cell 100 also includes a shunt drain line 110 connected between the drain terminals of transistors M1, M2 and node 102 and a second power supply node, e.g., the high power supply node $V_{DD}$. In the illustrated embodiment, the shunt drain line 110 include transmission line $T_5$, such as a shunt short stub. The shunt drain line 110 can contribute to the bandpass characteristics of the output of the stage at the drain lines. Specifically, the shunt drain line 110 can be configured to provide a bandpass filter in cooperation with the parasitic (internal) capacitance of the transistors M1, M2.

A bias voltage $V_G$ is provided at node 112 for DC biasing the gate terminals of the transistors M1, M2 to operate the transistors in the saturation region. In embodiments, voltage $V_G$ may be around 0.6V. This bias is provided through resistors $R_B$, which may have a large resistance around, for example, 10 kΩ.

In the cell 100, transmission lines $T_1$ to $T_4$ are designed with capacitors $C_1$ to $C_4$, and based on the frequency $F_{IN}$ of an input signal and frequency $F_{out}$ of the frequency doubled output signal, to provide the desired bandwidth characteristics. Transmission line $T_5$ is sized based on the impedance presented by the internal capacitance of the drains of the transistors M1, M2.

When an input fundamental signal is fed into each gate terminal along the gate line with high enough power level, harmonic signals will be generated via the nonlinearity of each transistor M1, M2. Both the fundamental and harmonic signals are generated but it is desired to keep the second harmonic signals and suppress the fundamental signals. A drain line with the band-pass filtering characteristics can suppress fundamental signals and achieve a good doubler function with fundamental rejection. Specifically, the bandpass drain lines 108a, 108b are used to pass the second harmonic signal with the suppression of the fundamental signal, while also blocking low and high-frequency interference that could otherwise appear at the output. The input signal can pass through the gate line then be suppressed by the drain line due to the bandpass filter. The bandpass characteristics of the input gate lines also suppress low and high frequency noise surrounding the fundamental input signal.

Figure 3:
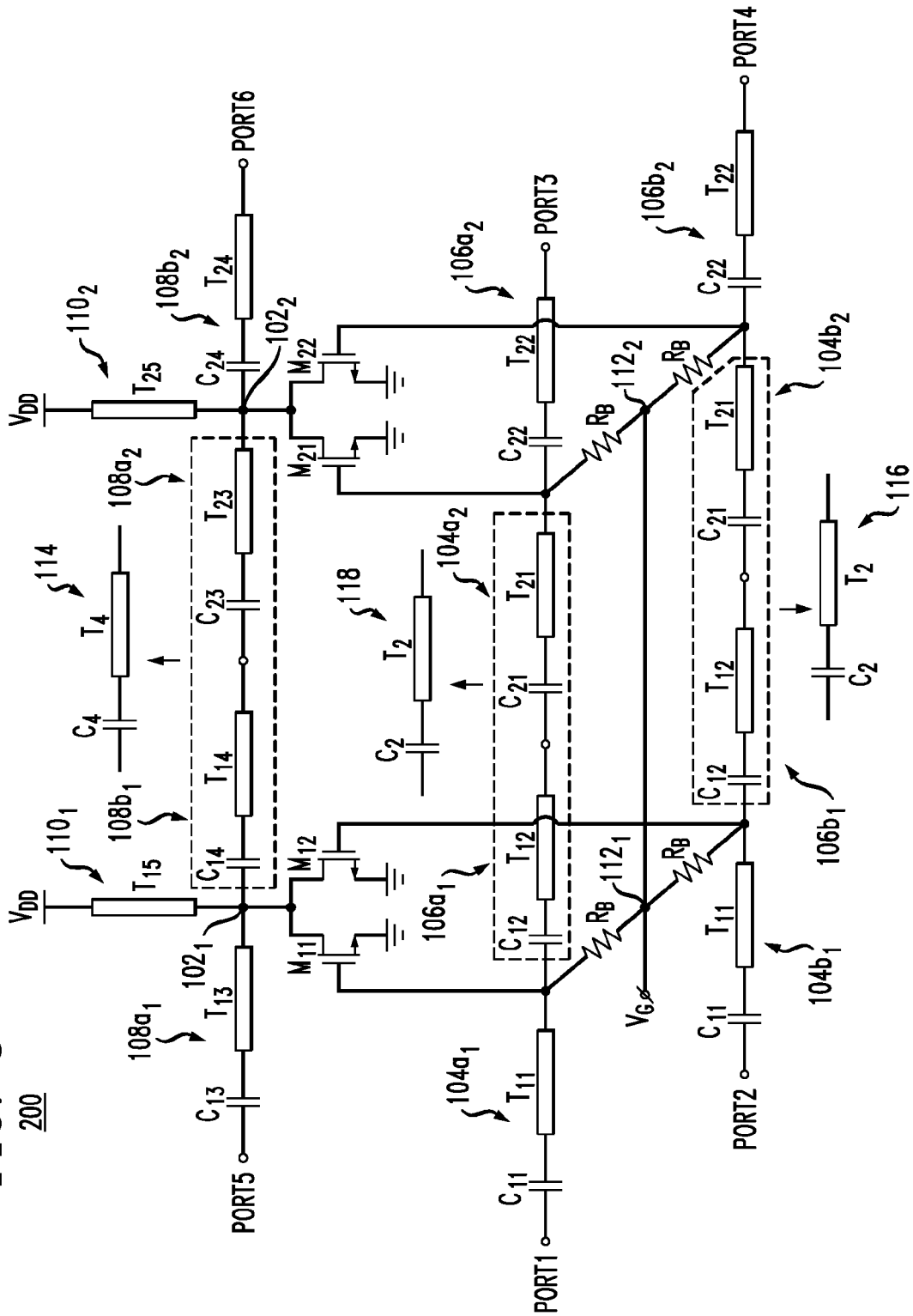
FIG. 3 illustrates the coupling of two basic cells or stages of FIG. 2 together.

FIG. 3 shows the combination 200 of two basic cells 100. Feature from the first cell are labeled with the subscript 1 and features from the second cell are labeled with the subscript 2. So, for example, the bandpass gate lines of the first cell are labeled $104a_1$, $104b_1$, $106a_1$ and $106b_1$, and the bandpass gate lines of the second cell are labeled $104a_2$, $104b_1$, $106a_1$ and $106b_1$. Likewise, the bandpass drain lines of the first cell are labeled $108a_1$ and $108b_1$, and the bandpass drain lines of the second cell are labeled $108a_2$ and $108b_2$. The drain shunt line of the first cell is labeled $110_1$ and the shunt line of the second cell is labeled $110_2$. Nodes $102_1$ and $112_1$ of the first cell and nodes $102_2$ and $112_2$ of the second cell are also labeled. Also, transistors M1 and M2 of the first cell are labeled $M_{11}$ and $M_{12}$, respectively, and transistors M1 and M2 of the second cell are labeled $M_{21}$ and $M_{22}$, respectively. Finally, the capacitors and transmission lines are also labeled with respective subscripts. So, for example, capacitor $C_1$ and transmission line $T_1$ of the first cell are labeled $C_{11}$ and $T_{11}$, respectively, and capacitor $C_1$ and transmission line $T_1$ of the second cell are labeled $C_{21}$ and $T_{21}$, respectively.

When two basic cells 100 are combined as shown in FIG. 3, the connected bandpass drain and gate lines can be simplified to the series connection of a single capacitor and single transmission line. So, the series connection of bandpass drain lines $108b_1$ and $108a_2$ is represented by the bandpass drain line 114, which includes capacitor $C_4$ and transmission line $T_4$, which is the sum of transmission lines $T_{14}$ and $T_{23}$. The capacitance value of C4 can be divided, e.g., $C4=C_{14}*C_{23}/(C_{14}+C_{23})$. The series connection of bandpass gate lines $106a_1$ and $104a_2$ is represented by the bandpass gate line 118, which includes capacitor $C_2$ and transmission line $T_2$. Finally, the series connection of bandpass gate lines $106b_1$ and $104b_2$ is represented by the bandpass gate line 116, which includes capacitor $C_2$ and transmission line $T_2$, which is the sum of transmission lines $T_{12}$ and $T_{21}$.

Figure 4:
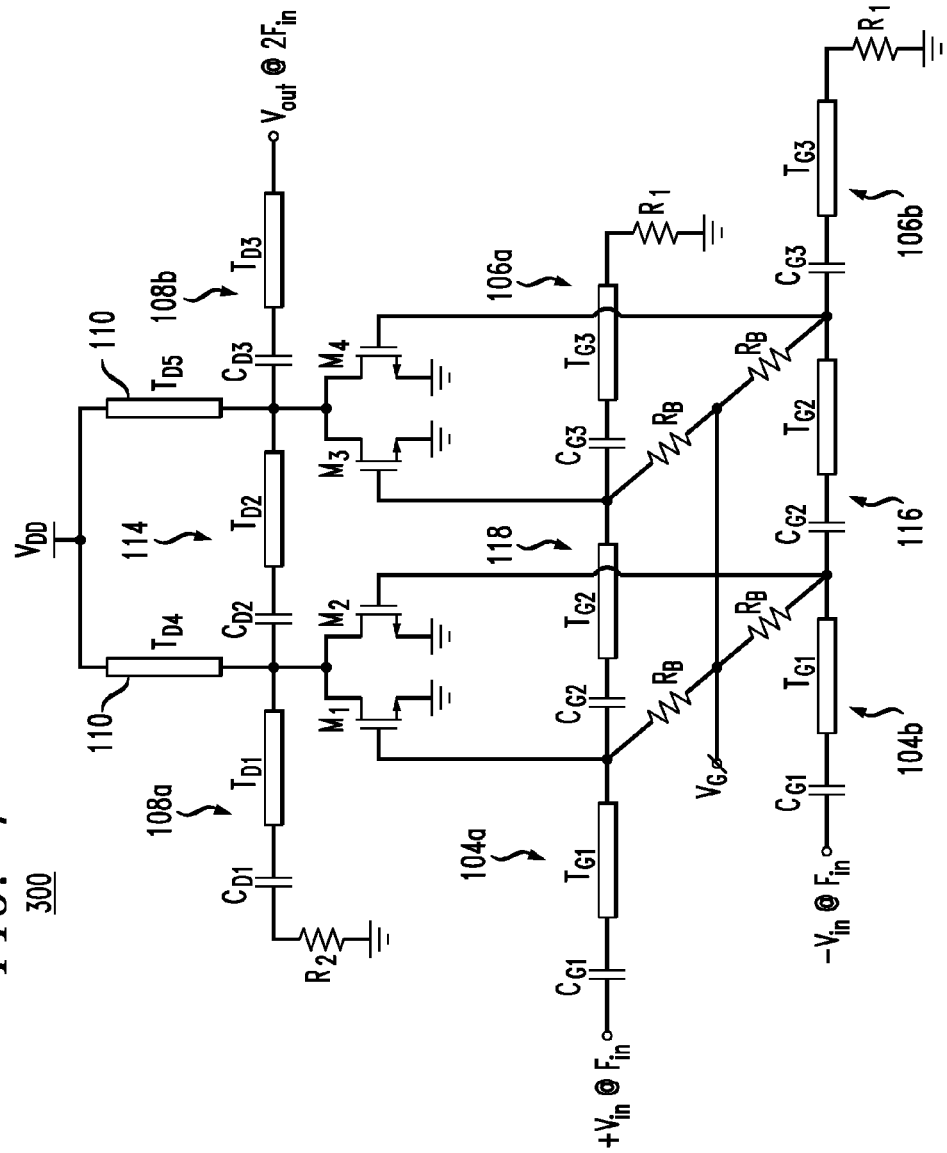
FIG. 4 illustrates a two-stage distributed wideband frequency doubler based on the basic cell or stage of FIG. 2.

FIG. 4 shows a completed wideband frequency doubler 300 based on having two stages and formed using the basic cells 100 and connection strategy 200 described above. The components of wideband frequency doubler 300 are identical to those illustrated in FIG. 3 only the capacitors and transmission lines of the bandpass drain lines are labeled as $C_D$ and $T_D$, respectively, with applicable subscripts, and the capacitors and transmission lines of the bandpass gate lines are labeled as $C_G$ and $T_G$, respectively, with applicable subscripts. Termination resistors $R_1$ are connected at Port3 and Port4 and termination resistor $R_2$ is connected at Port5. These resistors $R_1$, $R_2$ are designed to match the characteristic impedance of the drain transmission line and gate transmission lines, respectively, at their respective operating frequencies so as to avoid reflection of the wave. In embodiments, $R_1$ and $R_2$ have the same value and may be around 50Ω even though the operating frequency of the drain line is higher than the gate line. Differential input signals at frequency $F_{in}$, labeled $+V_{in}@F_{in}$ and $-V_{in}@F_{in}$, are provided at the Port1 and Port2 ports. The output, which has a frequency of twice $F_{in}$, is provided at output port Port6 of the drain line and labeled $V_{out}@2F_{in}$.

In embodiments, the transmission lines $T_1$ to $T_4$ take the form of microstrip lines. In embodiments, the transmission line T5 is in the form of a shorted shunt stub. The resistors $R_1$, $R_2$ and $R_B$ can be thin film resistors. Finally, the capacitors may be metal-insulator-metal (MIM) capacitors. In exemplary embodiments, transistors M1, M2 are MOSFET transistors formed using a CMOS process. In the embodiment shown, transistors M1 and M2 are NMOS transistors.

Figure 5:
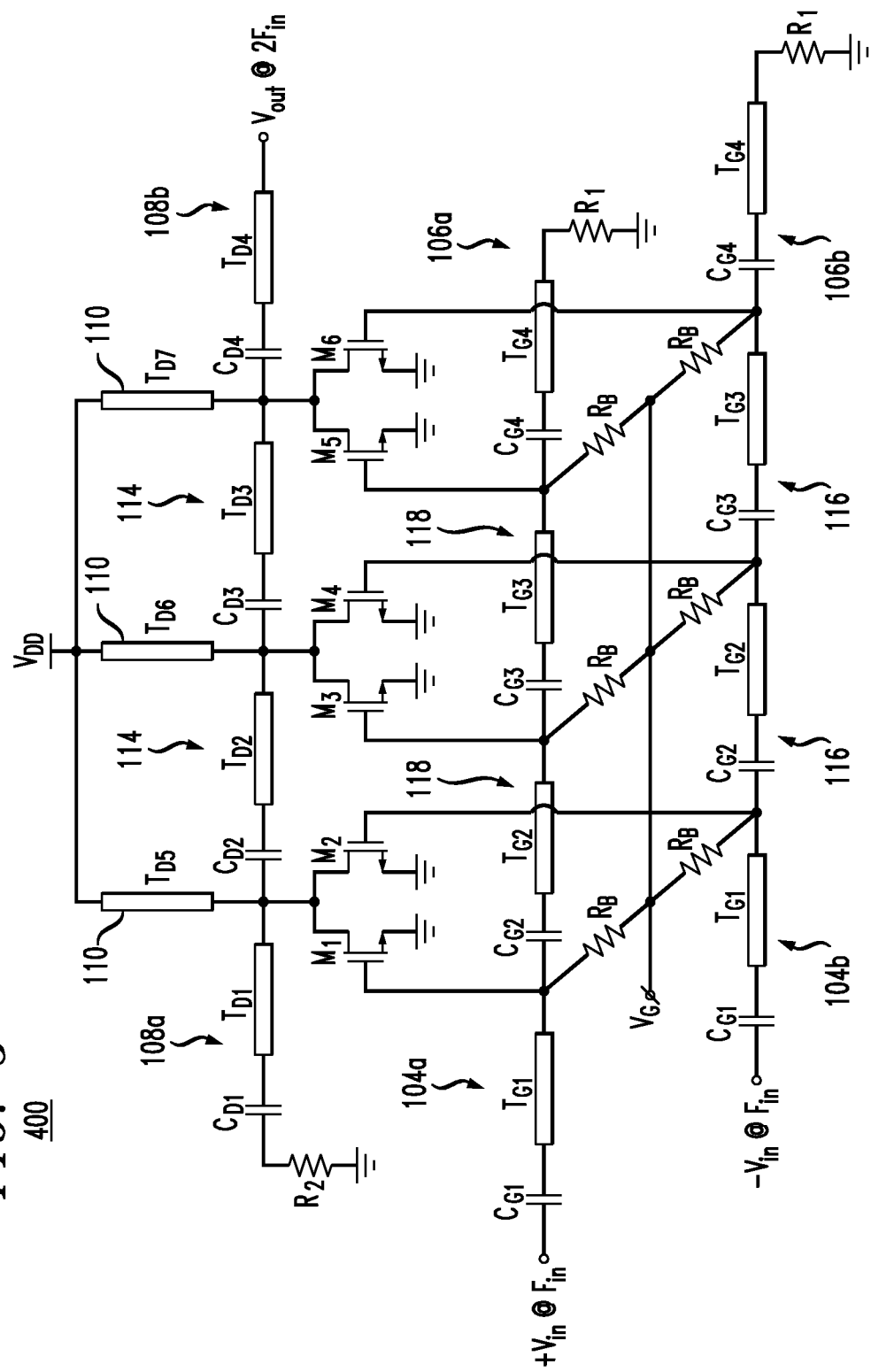
FIG. 5 illustrates a three-stage distributed wideband frequency doubler based on the basic cell or stage of FIG. 2.

FIG. 5 shows a completed three-stage wideband frequency doubler 400 formed using three basic cells 100 and the connection strategy 200 described above. The components of wideband frequency doubler 400 are identical to those illustrated in FIG. 4 only an extra cell stage has been added.

Figure 6:
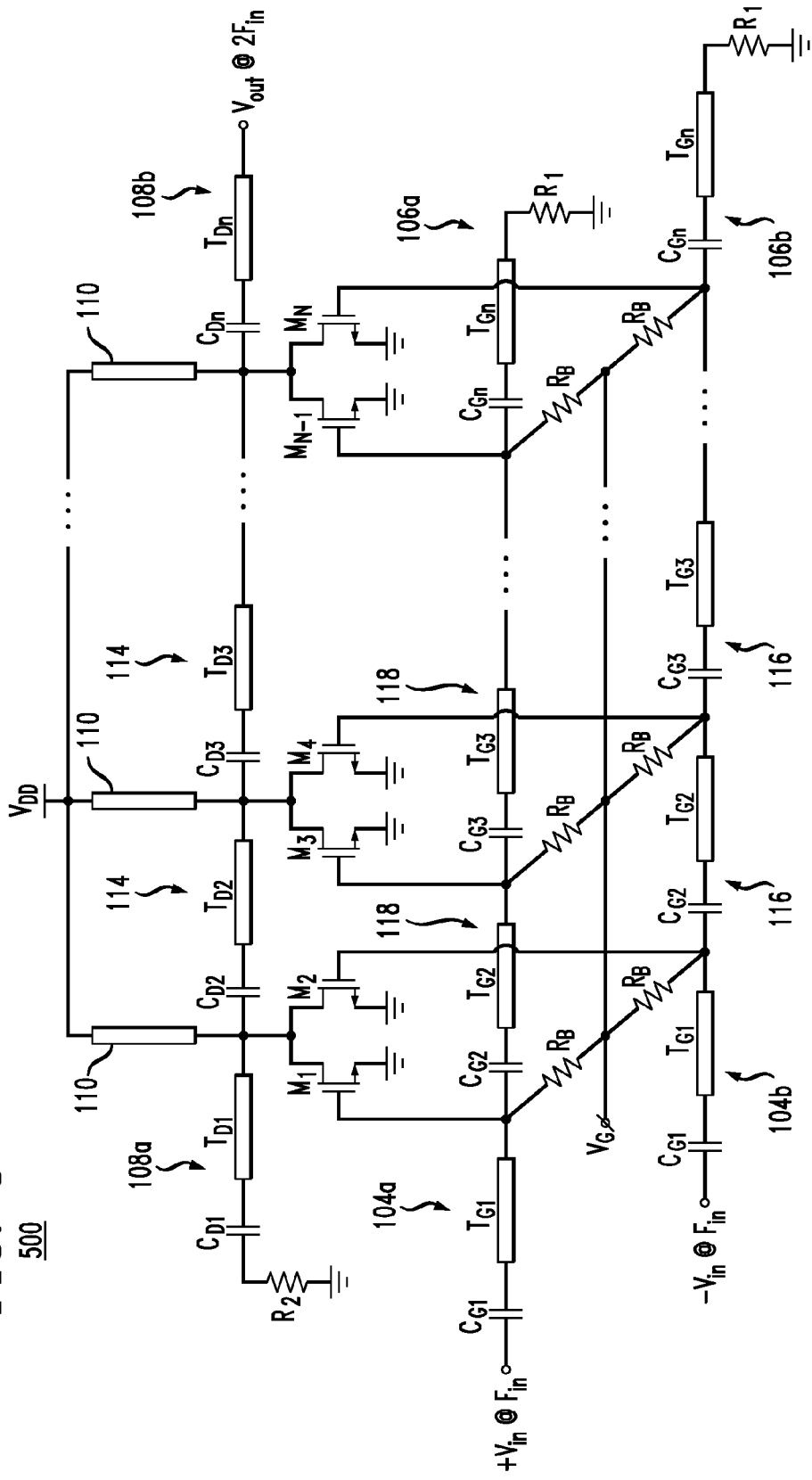
FIG. 6 illustrates generally a multi-stage distributed wideband frequency doubler based on the basic cell or stage of FIG. 2.

Although two and three stage circuits are illustrated in FIGS. 4 and 5, it should be understood that the number of stages is determined by the desired gain of the output and the bandwidth. That is, the more stages that are used, the wider the bandwidth, but the lower the gain. Therefore, these elements are considered when designing a wideband frequency doubler in accordance with the teachings herein. To that end, FIG. 6 illustrates that in embodiments the frequency doubler 500 can be extended to have more than three gain stages, where the total number of stage is n-1.

Figure 7A:
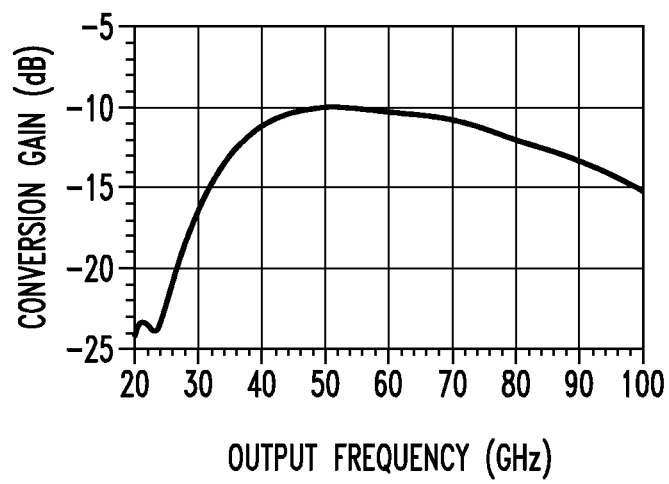
FIGS. 7A and 7B illustrate simulation results for a distributed wideband frequency doubler using the basic cell or stage of FIG. 2.
Figure 7B:
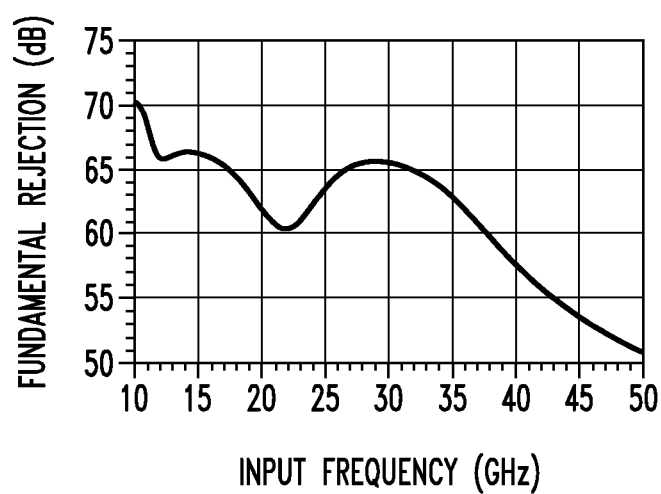

FIGS. 7A and 7B illustrate simulation results for the wideband frequency doubler described above, specifically one having three stages, based on Taiwan Semiconductor Manufacturing Corp.'s 65 nm CMOS process model. FIG. 7A illustrates the conversion gain versus output frequency. From the simulated results, the conversion gain is −10 dB while the output half-power (3 dB) bandwidth from this conversion gain is over 50 GHz wide from about 36 GHz to 87 GHz output frequency.

FIG. 7B illustrates fundamental rejection versus input frequency. The simulation results show that the fundamental signal rejection of better than 55 dB within the operating input frequency range of about 18 to 43.5 GHz.

FIG. 8 illustrates an alternative embodiment of a basic frequency doubler cell 100A. The cell is identical in all respects to the cell 100 of FIG. 2 only resistors $R_B$ are replaced with transmission lines $T_B$ for providing the gate bias to transistors M1, M2. In this embodiment, the transmission lines $T_B$ can cooperate with the parasitic (internal) capacitance of the transistors M1, M2 to provide further bandpass characteristics for the filtering the input signal at the gates of the transistors M1, M2.

Figure 9:
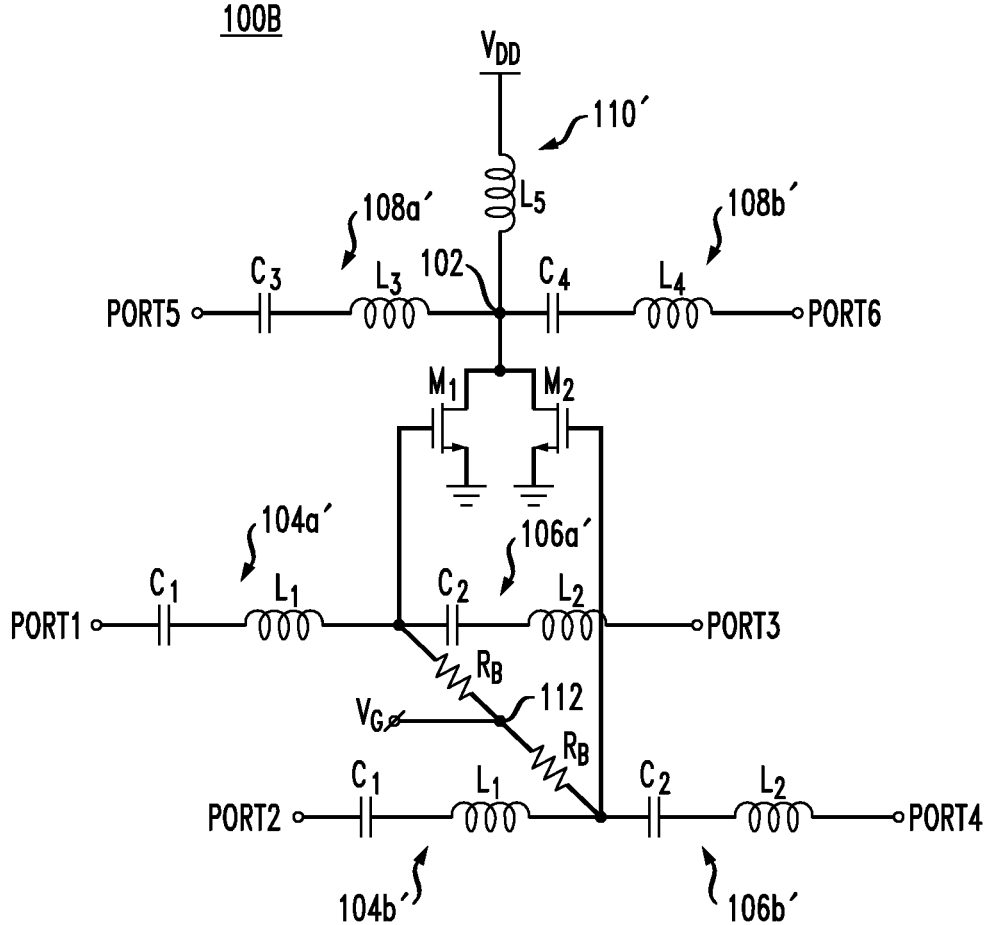
FIG. 9 illustrates another alternative embodiment of the basic cell or stage of FIG. 2.

FIG. 9 illustrates yet another alternative embodiment of a basic frequency doubler cell 100C. Cell 100B is identical to cell 100 of FIG. 2 except for modified drain bandpass lines 108a' and 108b', modified gate bandpass lines 104a', 104b', 106a' and 106b' and modified shunt line 110'. Specifically, the transmission lines $T_1$ to $T_5$ are replaced with inductors $L_1$ to $L_5$, respectively. The size of inductor $L_5$ is selected based on the impedance presented by the internal capacitance of the drains of the transistors M1, M2. The sizes of inductors $L_1$ to $L_4$ are selected based on the impedance presented by the capacitors $C_1$ to $C_4$, respectively.

FIG. 10 illustrates an embodiment utilizing two frequency doublers 400 to form a quadrature-phased enabled distributed wideband frequency doubler 600. The embodiment utilizes quadrature-phase inputs ($+V_{in\_}I@F_{in}$, $-V_{in\_}I@F_{in}$, $+V_{in\_}Q@F_{in}$, and $-V_{in}Q@F_{in}$) to provide the differential outputs: $+V_{out}@2_{Fin}$ and $-V_{out}@2F_{in}$.

As described herein, in order to obtain better fundamental and high-order harmonic rejection, the basic architecture for the improved wideband frequency doubler employs both bandpass drain and bandpass gate lines. This design can effectively suppress low and high frequency interference at both the input and the output to provide a high quality output signal. The bandpass characteristic of each drain and gate line can be obtained by using the series combination of a capacitor and a transmission line. In embodiments, additional shunt drain and gate lines can be added that cooperate with the parasitic (internal) capacitance from the transistors to provide further bandpass filter characteristics at the gate and drain lines. The basic cell architecture can be cascaded in multiple stages to provide a distributed wideband frequency doubler. In embodiments, the architecture uses MOSFET transistors, which provides for low cost and high integration.

In one embodiment, a millimeter-wave wideband frequency doubler stage for use in a distributed frequency doubler includes: a differential input pair of transistors, each transistor having respective gate, drain and source terminals, wherein the source terminals are coupled together to a first power supply node and the drain terminals are coupled together at a first node to a second power supply node; first and second pairs of bandpass gate lines coupled to the gate terminals of the transistors; and a pair of bandpass drain lines coupled to the drain terminals of the transistors.

In one embodiment of a millimeter-wave distributed wideband frequency doubler, the frequency doubler includes a pair of differential input ports, an output port, and at least two frequency doubler stages. Each stage includes: a differential input pair of transistors, each transistor having respective gate, drain and source terminals, wherein the source terminals are coupled together to a first power supply node and the drain terminals are coupled together to a second power supply node; first and second pairs of bandpass gate lines coupled to the gate terminals; and a pair of bandpass drain lines coupled to the drain terminals of the transistors.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A millimeter-wave wideband frequency doubler stage for use in a distributed frequency doubler, comprising:
   a differential input pair of transistors, each transistor having respective gate, drain and source terminals, wherein the source terminals are coupled together to a first power supply node and the drain terminals are coupled together at a first node to a second power supply node;
   first and second pairs of bandpass gate lines coupled to the gate terminals of the transistors; and
   a pair of bandpass drain lines coupled to the drain terminals of the transistors.

2. The millimeter-wave wideband frequency doubler stage of claim 1, further comprising a shunt drain line coupled between the drain terminals and the second power supply node, the shunt drain line configured to provide bandpass filter characteristics to an output of the frequency doubler stage in connection with internal capacitances of the transistors.

3. The millimeter-wave wideband frequency doubler stage of claim 1, wherein the bandpass gate lines and bandpass drain lines each include a capacitor in series with a transmission line.

4. The millimeter-wave wideband frequency doubler stage of claim 1, further comprising a gate biasing node coupled to the gate terminals of the transistors, wherein the gate biasing node is coupled to the gate terminals through a pair of resistors or a pair of transmission lines.

5. The millimeter-wave wideband frequency doubler of claim 1, wherein the bandpass gate lines and bandpass drain lines each include a capacitor in series with an inductor.

6. The millimeter-wave wideband frequency doubler stage of claim 1, further comprising an inductor coupled between the drain terminals and the second power supply node, the inductor configured to provide bandpass filter characteristics to an output of the frequency doubler stage in connection with internal capacitances of the transistors.

7. A millimeter-wave distributed wideband frequency doubler comprising:
   a pair of differential input ports;
   an output port;
   at least two frequency doubler stages, each stage comprising:
      a differential input pair of transistors, each transistor having respective gate, drain and source terminals, wherein the source terminals are coupled together to a first power supply node and the drain terminals are coupled together to a second power supply node;
      first and second pairs of bandpass gate lines coupled to the gate terminals; and
      a pair of bandpass drain lines coupled to the drain terminals of the transistors.

8. The millimeter-wave distributed wideband frequency doubler of claim 7, wherein:

a first one of the at least two frequency doubler stages is an input stage, the first pair of bandpass gate lines of the input stage is coupled between the gate terminals of the transistors of the input stage and the pair of differential input ports, the second pair of bandpass gate lines of the input stage is coupled between the gate terminals of the transistors of the input stage and a next stage from the at least two frequency doubler stages;

a first one of the pair of bandpass drain lines of the input stage is coupled between the drain terminals of the transistors of the input stage and a first termination impedance, and a second one of the pair of bandpass drain lines of the input stage is coupled between the drain terminals of the transistors of the input stage and the next stage from the at least two frequency doubler stages.

9. The millimeter-wave distributed wideband frequency doubler of claim 8, wherein:

a second one of the at least two frequency doubler stages is an output stage, the first pair of bandpass gate lines of the output stage is coupled between the gate terminals of the transistors of the output stage and a previous stage from the at least two frequency doubler stages, the second pair of bandpass gate lines of the output stage is coupled between the gate terminals of the transistors of the output stage and a second termination impedance, a first one of the pair of bandpass drain lines of the output stage is coupled between the drain terminals of the transistors of the output stage and the previous stage from the at least two frequency doubler stages, and a second one of the pair of bandpass drain lines of the output stage is coupled between the drain terminals of the transistors of the input stage and the output port.

10. The millimeter-wave distributed wideband frequency doubler of claim 9, wherein there are two stages and the input stage is connected to the output stage such that the input stage is the previous stage and the output stage is the next stage.

11. The millimeter-wave wide band distributed frequency doubler of claim 9, wherein there are at least three stages, including the input stage, the output stage and at least one intermediate stage coupled between the input and output stages.

12. The millimeter-wave distributed wideband frequency doubler of claim 9, wherein the bandpass gate lines and bandpass drain lines of each stage each include a capacitor in series with a transmission line.

13. The millimeter-wave distributed wideband frequency doubler of claim 7, wherein each stage further comprises a shunt drain line coupled between the drain terminals and the second power supply node, the shunt drain line configured to provide bandpass filter characteristics to the output of the frequency doubler stage in connection with internal capacitances of the transistors.

14. The millimeter-wave distributed wideband frequency doubler of claim 7, wherein the bandpass gate lines and bandpass drain lines of each stage each include a capacitor in series with a transmission line.

15. The millimeter-wave wideband frequency doubler of claim 7, further comprising a gate biasing node coupled to the gate terminals of the transistors of each stage, wherein the gate biasing node is coupled to the gate terminals of each stage through one of a respective pair of resistors and a respective pair of transmission lines.

16. The millimeter-wave distributed wideband frequency doubler of claim 7, wherein the bandpass gate lines and bandpass drain lines of each stage each include a capacitor in series with an inductor.

17. The millimeter-wave distributed wideband frequency doubler of claim 7, wherein each stage includes an inductor coupled between the drain terminals and the second power supply node, the inductor configured to provide bandpass filter characteristics to an output of the respective frequency doubler stage in connection with internal capacitances of the transistors.

18. The millimeter-wave distributed wideband frequency doubler of claim 7, further comprising a gate biasing node coupled to the gate terminals of the transistors of each stage, wherein the gate biasing node is coupled to the gate terminals of each stage a respective pair of transmission lines, the transmission lines configured to provide bandpass filter characteristics at an input to the respective frequency doubler stage in connection with internal capacitances of the transistors.

* * * * *